US011184990B2

United States Patent
(12) United States Patent
Chen et al.

(10) Patent No.: US 11,184,990 B2
(45) Date of Patent: Nov. 23, 2021

(54) FIXING DEVICE AND CHASSIS HAVING SAME

(71) Applicant: HONG FU JIN PRECISION INDUSTRY (WuHan) CO., LTD., Wuhan (CN)

(72) Inventors: Ching-Jou Chen, New Taipei (TW); Tzu-Wei Lai, New Taipei (TW); Wen-Hsiang Hung, New Taipei (TW); Jun-Bo Yang, Wuhan (CN); Chun-Bao Gu, Yantai (CN)

(73) Assignee: HONG FU JIN PRECISION INDUSTRY (WuHan) CO., LTD., Wuhan (CN)

( * ) Notice: Subject to any disclaimer, the term of this patent is extended or adjusted under 35 U.S.C. 154(b) by 0 days.

(21) Appl. No.: 16/906,458

(22) Filed: Jun. 19, 2020

(65) Prior Publication Data

US 2021/0212234 A1 Jul. 8, 2021

Related U.S. Application Data

(63) Continuation-in-part of application No. PCT/CN2020/070724, filed on Jan. 7, 2020.

(51) Int. Cl.
*H05K 5/00* (2006.01)
*H05K 7/14* (2006.01)

(52) U.S. Cl.
CPC .................................. *H05K 7/1429* (2013.01)

(58) Field of Classification Search
USPC ........................................ 361/752, 809, 810
See application file for complete search history.

(56) References Cited

U.S. PATENT DOCUMENTS 6,885,565 B2 * 4/2005 Shi .......................... G06F 1/184 361/732
7,746,664 B2 6/2010 Zhang et al.
7,787,258 B2 * 8/2010 Cheney ................ H05K 7/1431 361/801
8,553,424 B2 * 10/2013 Chiang ................ H05K 7/1408 361/759
8,853,543 B2 * 10/2014 Liu ...................... H05K 7/1418 174/138 G
2004/0062013 A1 * 4/2004 Kim ..................... H05K 7/1405 361/752

FOREIGN PATENT DOCUMENTS

CN 101470487 A 7/2009

* cited by examiner

*Primary Examiner* — Hung S. Bui
(74) *Attorney, Agent, or Firm* — ScienBiziP, P.C.

(57) ABSTRACT

The present disclosure provides a fixing device for fixing an external electronic component on a motherboard in a chassis. The fixing device includes a fixing block and a telescopic block. The fixing block is fixed on the chassis. One end of the telescopic block is slidably mounted in the fixing block, the other end protrudes from the fixing block and holds the electronic component. A chassis including the above-described fixing device to hold electronic components of different sizes is also provided.

10 Claims, 6 Drawing Sheets

II
20
100
10
300
200
400

FIXING DEVICE AND CHASSIS HAVING SAME

FIELD

The disclosure relates to a fixing device and a chassis having the fixing device.

BACKGROUND

At present, when electronic components that are not designed according to industrial specifications are inserted into a chassis, a fixing method needs to be changed according to electronic components of different sizes, causing huge inconvenience.

SUMMARY OF THE DISCLOSURE

In view of this, it is necessary to provide a fixing device that can easily adapt to electronic components of different sizes and a chassis having the fixing device.

In an embodiment of the present disclosure, a fixing device is used to fix an electronic component on a motherboard in a chassis. The fixing device includes a fixing block and a telescopic block. The fixing block is used to fix on the chassis. One end of the telescopic block is slidably installed in the fixing block, and the other end extends out of the fixing block and is used to hold the electronic component.

In an embodiment of the present disclosure, an end of the telescopic block protruding from the fixing block is provided with an insert slot, and the insert slot is used for holding a port provided on the electronic component.

In an embodiment of the present disclosure, the telescopic block is provided with a protruding rail, and the fixing block is provided with a groove. The telescopic block slides within the fixing block by the protruding rail inserting into the groove.

In an embodiment of the present disclosure, the fixing block is provided with an insert board, the chassis is provided with a baffle, both ends of the baffle are fixed to the chassis, a central portion of the baffle is bent toward the fixing block to form a holding slot, and the insert board is inserted into the holding slot to hold the fixing block on the chassis.

In an embodiment of the present disclosure, the fixing block is further provided with hooks. The hook includes a first protruding plate and a second protruding plate. The first protruding plate is connected to the fixing block, and the second protruding plate is connected below the end of the first protruding plate. The chassis is provided with through holes, and the hook extends into the through hole and hooks an outer wall of the chassis under the through hole to hold the fixing block on the chassis.

In an embodiment of the present disclosure, the fixing block is further provided with a stopping block, and the chassis is provided with a stopping hole. The stopping block is inserted into the stopping hole to limit the fixing block.

In an embodiment of the present disclosure, the stopping block and the fixing block are connected by a resilient board, and the stopping block is further provided with a handle. The handle is pressed for conveniently pulling out the stopping block from the stopping hole. The resilient board is used to elastically reset the stopping block after releasing the handle.

In an embodiment of the present disclosure, a chassis including the above-described fixing device is also provided.

The above-described fixing device and the chassis having the fixing device achieve the purpose of conveniently fixing electronic components of different sizes through the fixing block, the telescopic block, and the holding slot.

SYMBOL DISCRIPTION OF MAIN COMPONENTS

Figure 1:
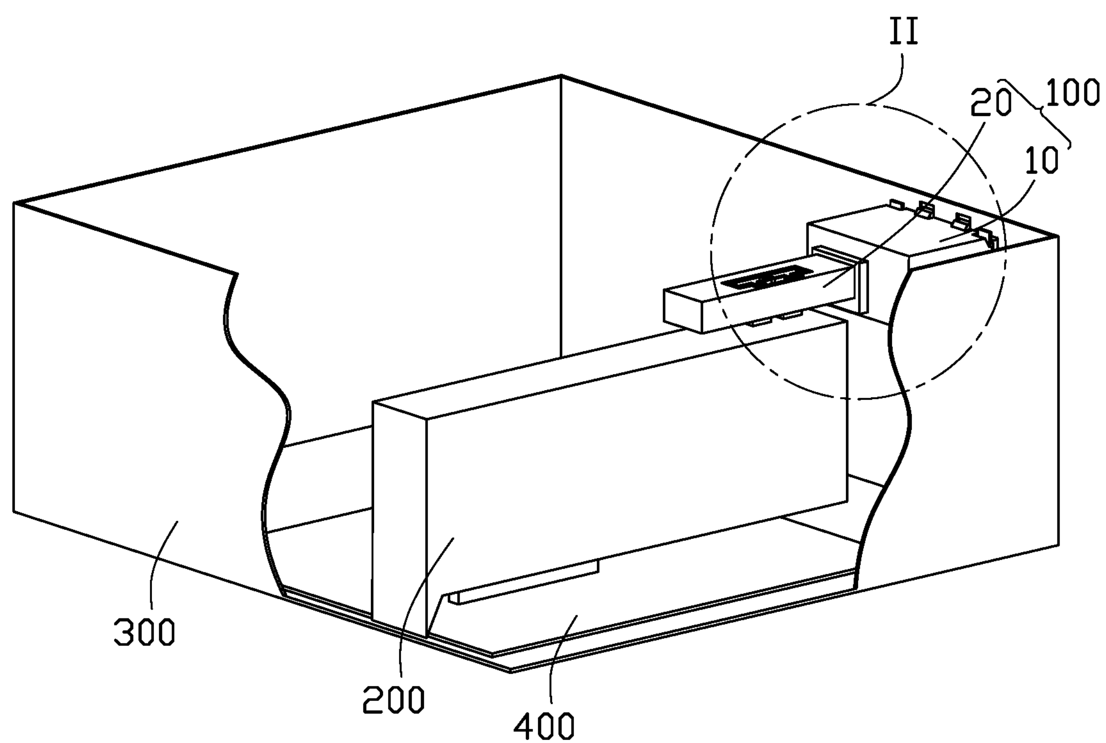
FIG. 1 is a front perspective view of a fixing device in an embodiment of the disclosure.

Fixing device 100
Electronic component 200
Port 210
Chassis 300
Baffle 310
Insert slot 311
Through hole 320
Stopping hole 330
Motherboard 400
Fixing block 10
Groove 11
Insert board 12
Hook 13
First protruding plate 131
Second protruding plate 132
Stopping block 14
Level surface 141
Inclined surface 142
Handle 143
Resilient board 15
Telescopic block 20
Holding slot 21
Protruding rail 22

DETAILED DESCRIPTION

The technical solutions in the embodiments of the present disclosure will be described clearly and completely in conjunction with the drawings in the embodiments of the present disclosure. Obviously, the described embodiments are only a part of the embodiments of the present disclosure, but not all of the embodiments. Based on the embodiments of the present disclosure, all other embodiments obtained by a person of ordinary skill in the art without making creative efforts fall within the protection scope of the present disclosure.

It should be noted that when a component is said to be "fixed to" another component, it can be fixed directly to another component or it can be fixed indirectly through an intermediate component. When a component is considered to "connect" to another component, it can be directly connected to another component or it can be indirectly connected through an intermediate component. When a component is considered to be "set on" another component, it can be set directly on another component or indirectly through an intermediate component. The terms "vertical", "horizontal", "left", "right" and similar expressions used herein are for illustrative purposes only.

Unless otherwise defined, all technical and scientific terms used herein have the same meaning as commonly understood by those skilled in the technical field of the present disclosure. The terminology used in the description of the present disclosure herein is for the purpose of describing specific embodiments, and is not intended to limit the present disclosure. The term "or/and" as used herein includes any and all combinations of one or more related listed items.

The following describes some embodiments of the present disclosure in detail with reference to the accompanying drawings. In the case of no conflict, the following embodiments and features in the embodiments can be combined with each other.

Referring to FIG. 1, a fixing device 100 is used to perpendicularly fix an external electronic component 200 on a motherboard 400 in a chassis 300. The motherboard 400 is placed on a bottom surface inside the chassis 300. The electronic component 200 is perpendicularly electrically connected to the motherboard 400 through the chassis 300. The fixing device 100 is installed on a side wall of the chassis 300 to fix the electronic component 200.

The fixing device 100 includes a fixing block 10 and a telescopic block 20. The fixing block 10 is fixed on the side wall of the chassis 300. One end of the telescopic block 20 is slidably installed in the fixing block 10, and the other end extends out of the fixing block 10 and is used to hold the electronic component 200.

Figure 2:
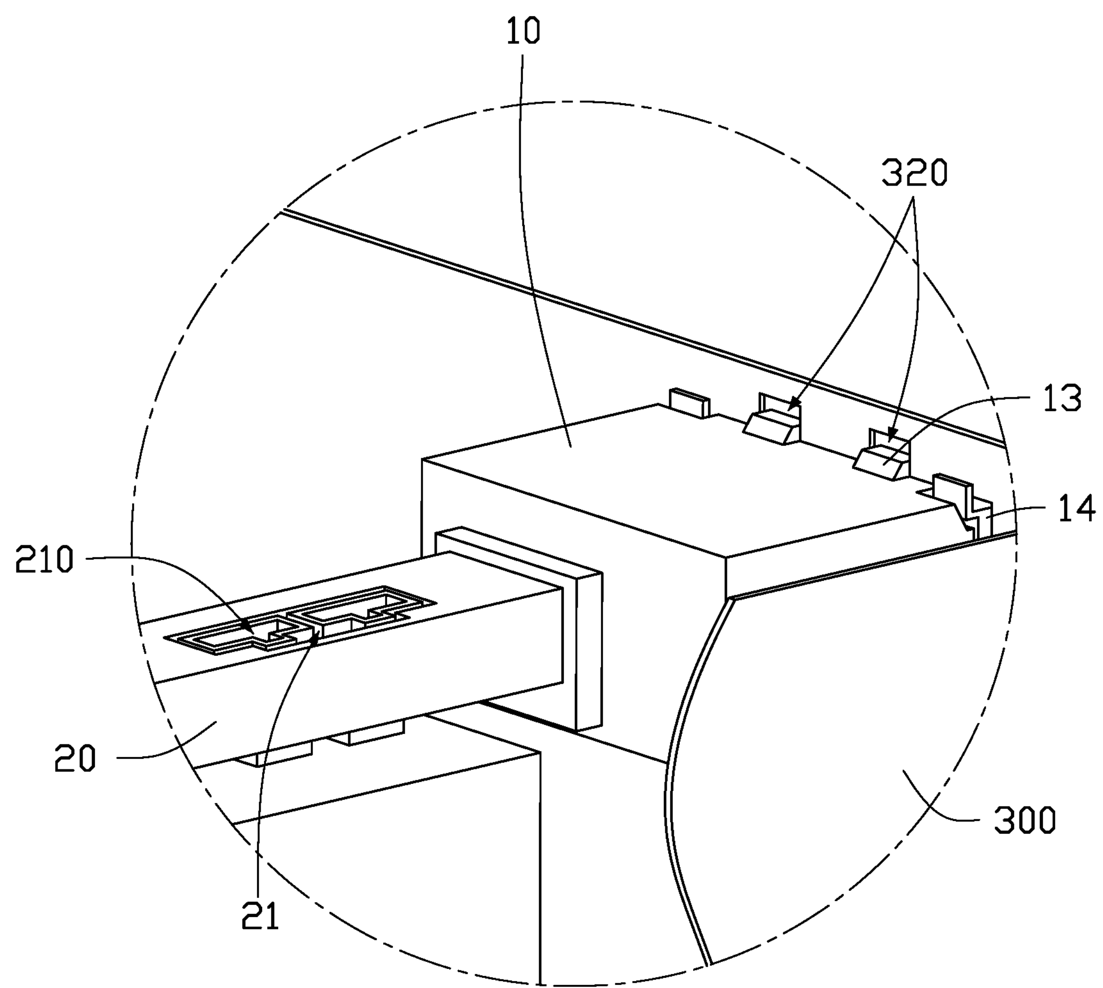
FIG. 2 is a partially enlarged view of II in FIG. 1.
Figure 3:
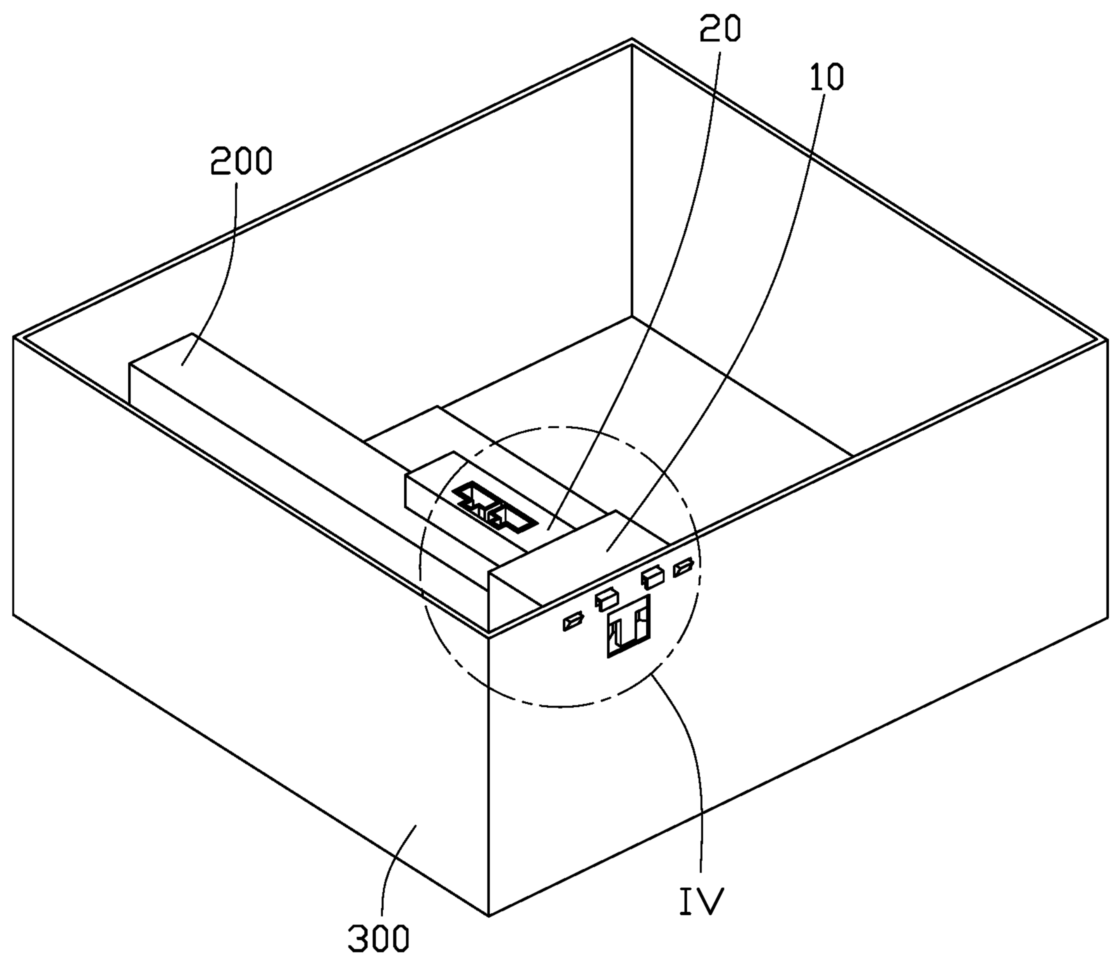
FIG. 3 is a perspective schematic view of the rear side of the fixing device in FIG. 1.
Figure 4:
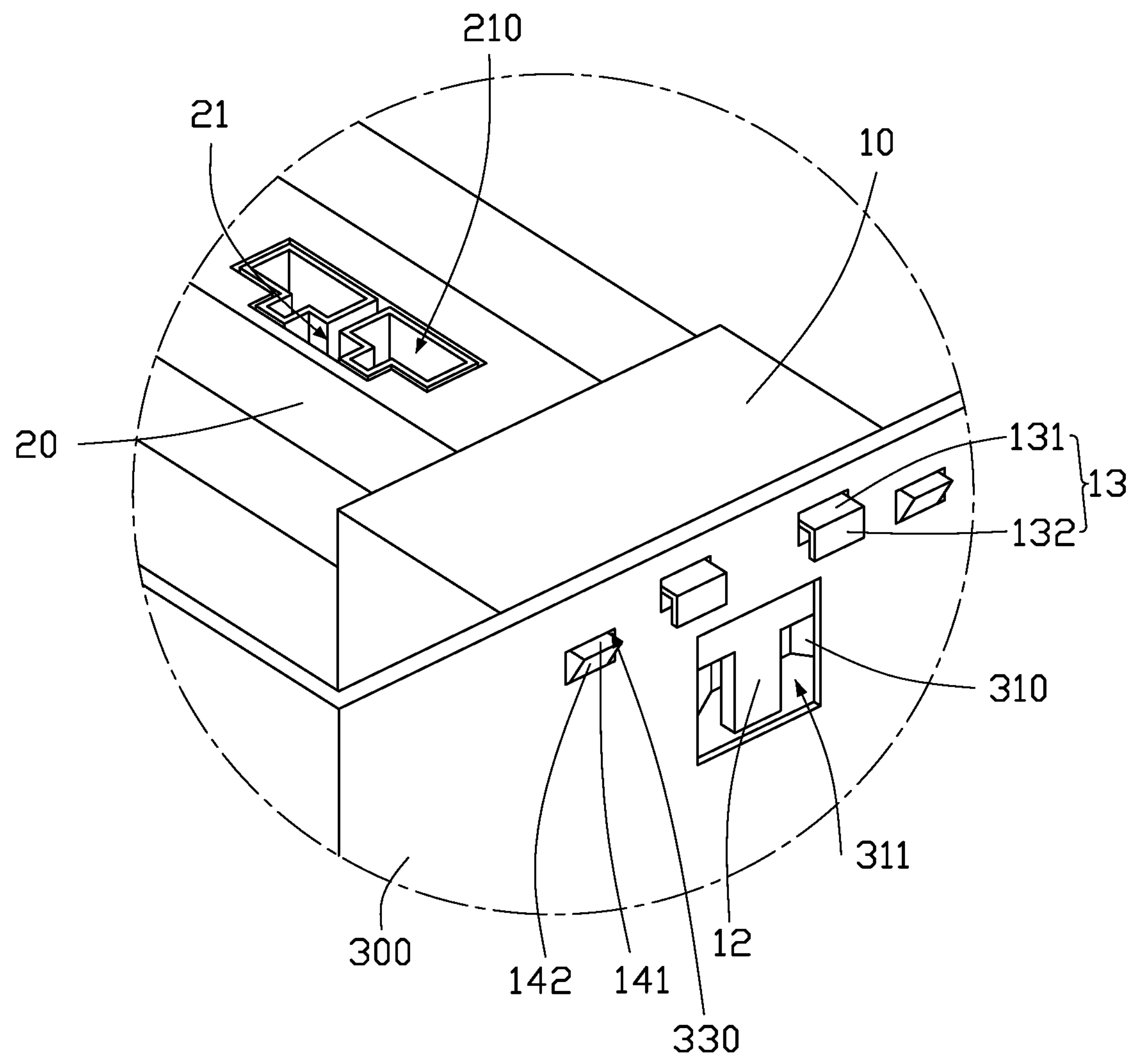
FIG. 4 is a partially enlarged view of IV in FIG. 3.

Referring to FIG. 2, the electronic component 200 is provided with a port 210. The end of the telescopic block 20 protruding from the fixing block 10 is provided with a corresponding holding slot 21, and the shape of the holding slot 21 is the same as the shape of the port 210. The holding slot 21 is used to hold the port 210 to fix the electronic component 200.

Figure 5:
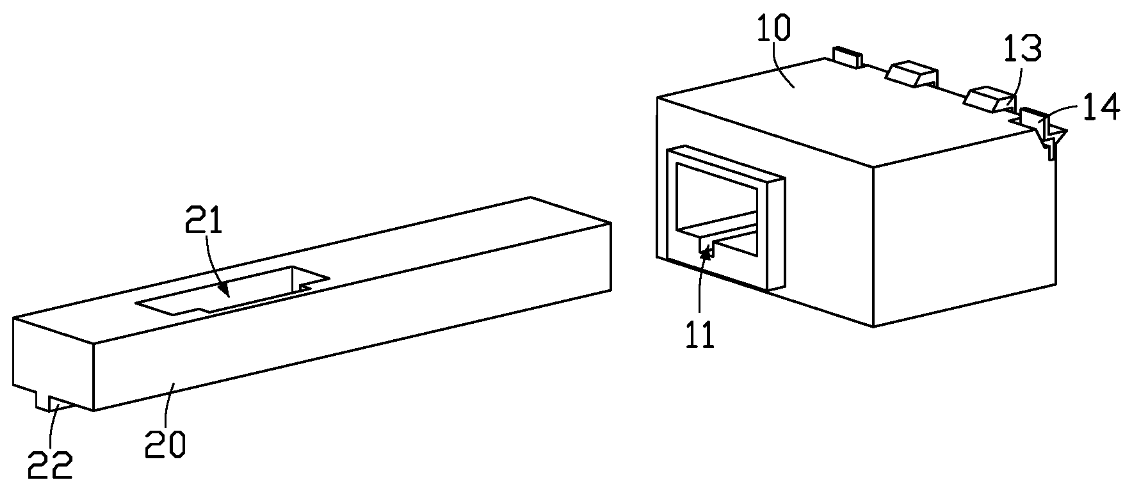
FIG. 5 is a perspective schematic view of a fixing block and a telescopic block in FIG. 1.
Figure 6:
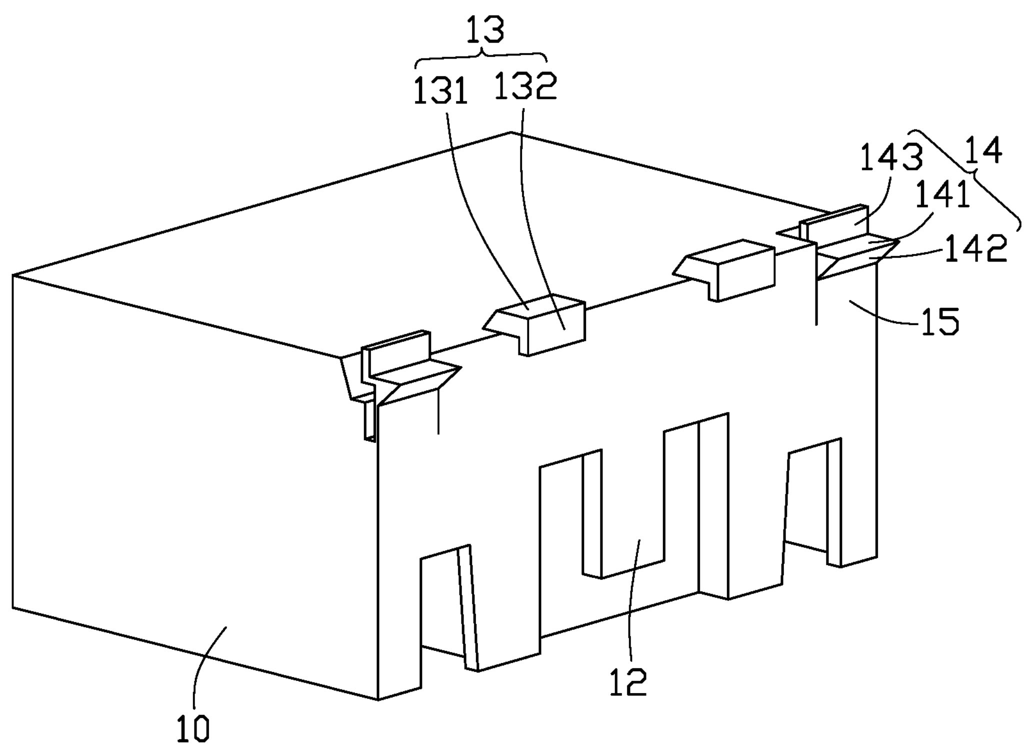
FIG. 6 is a perspective schematic view of the back of the fixing block in FIG. 1.

Referring to FIG. 5, the telescopic block 20 is provided with a protruding rail 22, and the fixing block 10 is provided with a groove 11. The telescopic block 20 slides within the fixing block 10 (in the direction of the groove 11) by the protruding rail 22 inserting into the groove 11.

Please refer to FIG. 3, FIG. 4, FIG. 5, and FIG. 6. The fixing block 10 is provided with an insert board 12 directed downward. The chassis 300 is provided with a baffle 310. Both ends of the baffle 310 are fixed to the chassis 300, and a center portion of the baffle 310 is bent toward the fixing block 10 to form an insert slot 311. The insert board 12 is inserted into the insert slot to hold the fixing block 10 on the chassis 300.

The fixing block 10 is also provided with two downwardly extending hooks 13. The hook 13 includes a first protruding plate 131 and a second protruding plate 132. The first protruding plate 131 is connected to the fixing block 10, and the second protruding plate 132 is connected below the end of the first protruding plate 131. The chassis 300 is provided with two through holes 320 (shown in FIG. 2). The hook 13 extends into the through hole 320 and hooks the outer wall of the chassis 300 under the through hole 320 to hold the fixing block 10 on the chassis 300.

The fixing block 10 is also provided with a stopping block 14. The stopping block 14 includes an upward-facing level surface 141 and a downward-facing inclined surface 142. The chassis 300 is provided with a stopping hole 330, and the stopping block 14 is inserted into the stopping hole 330. An upper wall of the stopping hole 330 limits movement of the level surface 141 (in the upward direction).

The fixing block 10 is also provided with a resilient board 15. The stopping block 14 and the fixing block 10 are connected by the resilient board 15. The stopping block 14 is also provided with a handle 143. The handle 143 is used to conveniently pull the stopping block 14 out of the stopping hole 330, and the resilient board 15 is used to elastically reset the stopping block 14.

The working mode of the present disclosure is that when the electronic component 200 is inserted into the chassis 300, the telescopic block 20 is extended to a desired position, so that the holding slot 21 holds the port 210; the insert board 12 and the hooks 13 of the fixing block 10 are respectively inserted into the insert slot and the through holes 320, and the stopping block 14 extends into the stopping hole 330 to fix the fixing block 10 on the chassis 300; when the electronic component 200 needs to be taken out, the handle 143 is pulled to pull out the stopping block 14, and at the same time, the insert board 12 and the hooks 13 of the fixing block 10 are removed from the insert slot and the through holes 320, respectively; the telescopic block 20 is separated from the electronic component 200.

It can be understood that, in other embodiments, the fixing block 10 may be provided with other numbers of hooks 13, and the chassis 300 is provided with other numbers of through holes 320; and the chassis 300 and the fixing device 100 may be integrated into one body.

The fixing device 100 and the chassis 300 with the fixing device 100 achieve the purpose of conveniently fixing the electronic components 200 of different sizes through the fixing block 10, the telescopic block 20, and the holding slot 21.

The above embodiments are only used to illustrate the technical solutions of the present disclosure and not to limit them. Although the present disclosure has been described in detail with reference to the above preferred embodiments, those of ordinary skill in the art should understand that the technical solutions of the present disclosure can be modified or equivalently replaced without deviating from the spirit and scope of the technical solutions of the present disclosure. Those skilled in the art can also make other changes within the spirit of the present disclosure and use them in the design of the present disclosure, as long as they do not deviate from the technical effects of the present disclosure. These changes made in accordance with the spirit of the present disclosure should be included in the scope claimed by the present disclosure.

What is claimed is:

1. A fixing device used to fix an electronic component on a motherboard in a chassis, wherein: the fixing device comprises a fixing block and a telescopic block; the fixing block is used for fixing on the chassis, one end of the telescopic block is slidably installed in the fixing block, and the other end extends out of the fixing block and is used to hold the electronic component, the fixing block is provided with an insert board, the chassis is provided with a baffle, both ends of the baffle are fixed to the chassis, a central portion of the baffle is bent toward the fixing block to form an insert slot, and the insert board is inserted into the insert slot to hold the fixing block on the chassis, the fixing block is further provided with hooks, the hook comprises a first protruding plate and a second protruding plate, the first protruding plate is connected to the fixing block, the second protruding plate is connected below an end of the first protruding plate, the chassis is provided with through holes, the hooks extends into the through holes and hook an outer wall of the chassis under the through hole.

2. The fixing device according to claim 1, wherein: the end of the telescopic block extending out of the fixing block is provided with a holding slot, and the holding slot is used for holding a port provided on the electronic component.

3. The fixing device according to claim 2, wherein the telescopic block is provided with a protruding rail, the fixing block is provided with a groove, and the telescopic block slides within the fixing block by the protruding rail inserting into the groove.

4. The fixing device according to claim 1, wherein the fixing block is further provided with a stopping block, the chassis is provided with a stopping hole, and the stopping block is inserted into the stopping hole.

5. The fixing device according to claim 4, wherein the stopping block and the fixing block are connected by a resilient board, the stopping block is further provided with a handle, the handle is pressed for conveniently pulling out the stopping block from the stopping hole, and the resilient board is used to elastically reset the stopping block after releasing the handle.

6. A chassis, characterized in that the chassis comprises a fixing device used to fix an electronic component on a motherboard in the chassis, wherein: the fixing device comprises a fixing block and a telescopic block; the fixing block is used for fixing on the chassis, one end of the telescopic block is slidably installed in the fixing block, and the other end extends out of the fixing block and is used to hold the electronic component, the fixing block is provided with an insert board, the chassis is provided with a baffle, both ends of the baffle are fixed to the chassis, a central portion of the baffle is bent toward the fixing block to form an insert slot, and the insert board is inserted into the insert slot to hold the fixing block on the chassis, the fixing block is further provided with hooks, the hook comprises a first protruding plate and a second protruding plate, the first protruding plate is connected to the fixing block, the second protruding plate is connected below an end of the first protruding plate, the chassis is provided with through holes, the hooks extends into the through holes and hook an outer wall of the chassis under the through hole.

7. The chassis of claim 6, characterized in that the end of the telescopic block extending out of the fixing block is provided with a holding slot, and the holding slot is used for holding a port provided on the electronic component.

8. The chassis of claim 7, wherein the telescopic block is provided with a protruding rail, the fixing block is provided with a groove, and the telescopic block slides within the fixing block by the protruding rail inserting into the groove.

9. The chassis of claim 6, wherein the fixing block is further provided with a stopping block, the chassis is provided with a stopping hole, and the stopping block is inserted into the stopping hole.

10. The chassis of claim 9, wherein the stopping block and the fixing block are connected by a resilient board, the stopping block is further provided with a handle, the handle is pressed for conveniently pulling out the stopping block from the stopping hole, and the resilient board is used to elastically reset the stopping block after releasing the handle.

* * * * *